(12) United States Patent
Yoshikawa et al.

(10) Patent No.: US 7,881,354 B2
(45) Date of Patent: Feb. 1, 2011

(54) VCSEL, MANUFACTURING METHOD THEREOF, OPTICAL DEVICE, LIGHT IRRADIATION DEVICE, DATA PROCESSING DEVICE, LIGHT SENDING DEVICE, OPTICAL SPATIAL TRANSMISSION DEVICE, AND OPTICAL TRANSMISSION SYSTEM

(75) Inventors: Masahiro Yoshikawa, Kanagawa (JP); Masateru Yamamoto, Kanagawa (JP); Takashi Kondo, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 159 days.

(21) Appl. No.: 11/880,494

(22) Filed: Jul. 23, 2007

(65) Prior Publication Data

US 2008/0187015 A1 Aug. 7, 2008

(30) Foreign Application Priority Data

Feb. 2, 2007 (JP) ............................. 2007-024089

(51) Int. Cl.
*H01S 5/00* (2006.01)
(52) U.S. Cl. ................................ 372/46.013; 372/44.01
(58) Field of Classification Search ............. 372/46.013
See application file for complete search history.

(56) References Cited

U.S. PATENT DOCUMENTS 5,594,751 A * 1/1997 Scott ..................... 372/46.013
6,311,894 B1 * 11/2001 Miyajima et al. ......... 235/462.36
2002/0071471 A1 * 6/2002 Kim et al. .................... 372/96
2003/0174750 A1 * 9/2003 Otsubo ......................... 372/45
2004/0184498 A1 * 9/2004 Ueki ............................ 372/45

FOREIGN PATENT DOCUMENTS

| JP | 2000-12974 | 1/2000 |
| JP | 2000-22204 | 1/2000 |
| JP | 2000-183461 | 6/2000 |

* cited by examiner

*Primary Examiner*—Minsun Harvey
*Assistant Examiner*—Joshua King
(74) *Attorney, Agent, or Firm*—Fildes & Outland, P.C.

(57) ABSTRACT

A VCSEL includes a first conductivity-type first semiconductor mirror layer on a substrate, an active region thereon, a second conductivity-type second semiconductor mirror layer thereon, and a current confining layer in proximity to the active region. A mesa structure is formed such that at least a side surface of the current confining layer is exposed. The current confining layer includes a first semiconductor layer having an Al-composition and a second semiconductor layer having an Al-composition and being formed nearer to the active region than the first semiconductor layer does. Al concentration of the first semiconductor layer is higher than that of the second semiconductor layer. When oscillation wavelength of laser light is $\lambda$, optical thickness being sum of the thickness of the first and second semiconductor layers is $\lambda/4$. The first and second semiconductor layers are selectively oxidized from the side surface of the mesa structure.

14 Claims, 10 Drawing Sheets

Cross sectional view along line A-A

Cross sectional view along line A-A

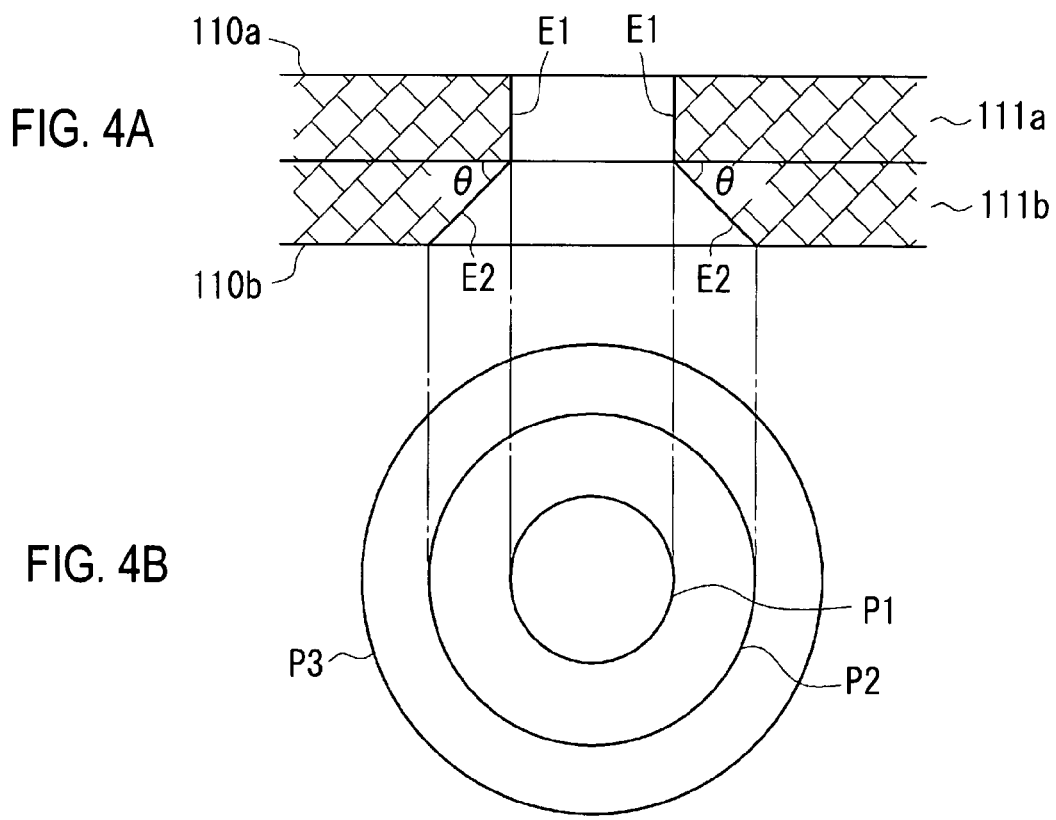
FIG. 4A
FIG. 4B
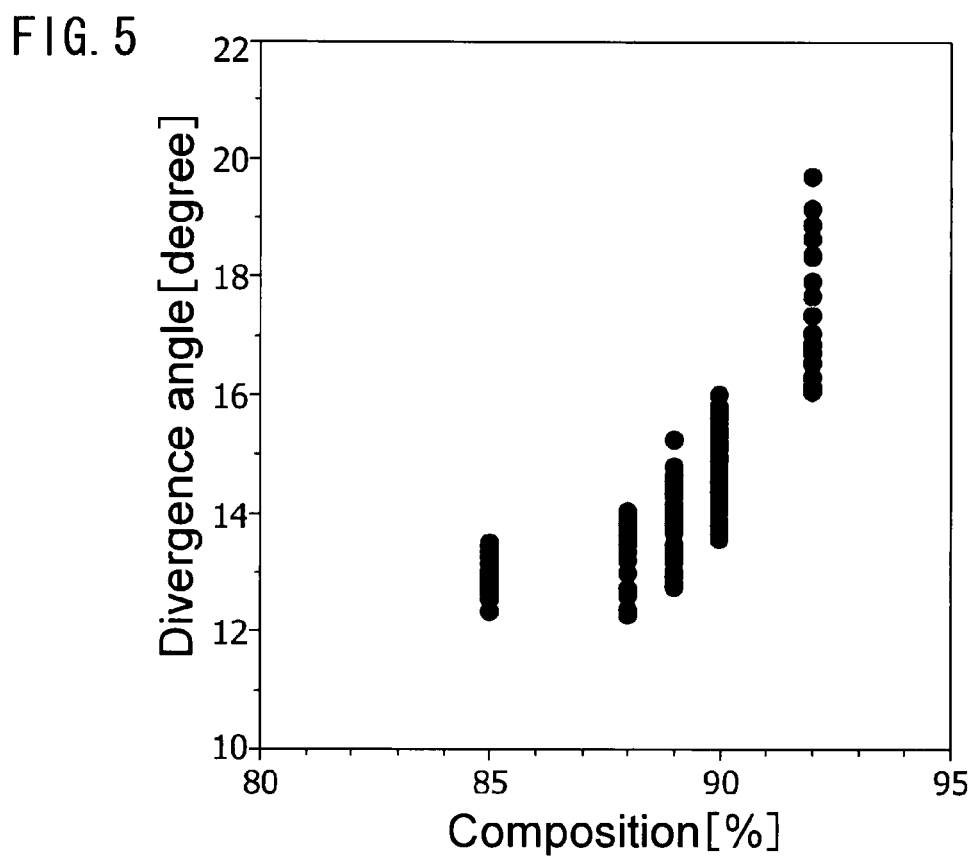
FIG. 5

700 Optical transmission device

800 Video transmission system

VCSEL, MANUFACTURING METHOD THEREOF, OPTICAL DEVICE, LIGHT IRRADIATION DEVICE, DATA PROCESSING DEVICE, LIGHT SENDING DEVICE, OPTICAL SPATIAL TRANSMISSION DEVICE, AND OPTICAL TRANSMISSION SYSTEM

CROSS-REFERENCE TO RELATED APPLICATIONS

This application is based on and claims priority under 35 USC 119 from Japanese Patent Application No. 2007-024089 filed Feb. 2, 2007.

BACKGROUND

1. Technical Field

The present invention relates to a Vertical-Cavity Surface-Emitting Laser diode (hereinafter referred to as VCSEL), an optical device, a light irradiation device, a data processing device, a light sending device, an optical spatial transmission device, an optical transmission system, and a method for manufacturing a VCSEL.

2. Related Art

In technical fields such as optical communication or optical storage, there has been a growing interest in VCSELs. VCSELs have excellent characteristics that edge-emitting semiconductor lasers do not have. For example, VCSELs are characterized by lower threshold current and smaller power consumption. With a VCSEL, a round light spot can be easily obtained. Also, evaluation can be performed while VCSELs are on a wafer, and light sources can be arranged in two-dimensional arrays. With these characteristics, demands especially as light sources in the communication and data storage fields have been expected to grow.

When a VCSEL is used as a light source in optical communication or optical storage, it is required that divergence angle or far field pattern (FFP) of laser light emitted from the VCSEL be smaller than a certain value. If divergence angle becomes greater, spot diameter becomes greater, thereby error occurrence in optical communication may increase, or resolution in reading or writing data from or to a storage media may be reduced.

In a GaAs-type VCSEL that emits 850-nm laser light, a high-Al-composition AlAs or AlGaAs is used for a current confining layer. The current confining layer is formed in a mesa, and oxidized to a certain distance from a side surface of the mesa in an oxidizing process to form a conductive region (oxidized aperture) inside surrounded by an oxidized region.

The divergence angle of a VCSEL depends on the diameter of an oxidized aperture formed in the current confining layer. More specifically, if the diameter of the oxidized aperture becomes smaller, divergence angle tends to become greater, and if the diameter of the oxidized aperture becomes greater, divergence angle tends to become smaller. In addition, the oxidized aperture is a critical factor in deciding lasing mode of laser light. In order to obtain a single-mode laser light, the oxidized aperture should be made smaller.

A mesa is processed in a cylindrical or rectangular shape by etching semiconductor layers stacked on a substrate. Depending on accuracy in the processing, the size of the diameter may vary. In addition, if a current confining layer is oxidized from a side surface of the mesa having such a structure, variations due to oxidation may also occur. Especially if the diameter of an oxidized aperture becomes as small as in single-mode, it is difficult to reproduce the diameter of the oxidized aperture, which makes it difficult to control divergence angle.

An object of the present invention is to provide a VCSEL in which divergence angle can be made smaller than that of related arts, and a module, a light source device, a data processing device, a light sending device, an optical spatial transmission device, and an optical spatial transmission system that use the VCSEL, and a method for manufacturing a VCSEL.

SUMMARY

According to an aspect of the invention, there is provided a VCSEL that includes a first semiconductor mirror layer of a first conductivity type on a substrate, an active region on the first semiconductor mirror layer, a second semiconductor mirror layer of a second conductivity type on the active region, and a current confining layer in proximity to the active region. A mesa structure is formed such that at least a side surface of the current confining layer is exposed. The current confining layer includes a first semiconductor layer having an Al-composition and a second semiconductor layer having an Al-composition formed nearer to the active region than the first semiconductor layer does. Al concentration of the first semiconductor layer is higher than Al concentration of the second semiconductor layer. When oscillation wavelength of laser light is $\lambda$, optical thickness being the sum of the thickness of the first and second semiconductor layers is $\lambda/4$. The first and second semiconductor layers are selectively oxidized from the side surface of the mesa structure.

BRIEF DESCRIPTION OF THE DRAWINGS

Exemplary embodiments of the present invention will be described in detail based on the following figures, wherein:

FIG. 4A is a cross sectional view schematically illustrating end surfaces of oxidized regions formed in an AlAs layer and an $Al_{0.88}Ga_{0.12}As$ layer;

FIG. 4B is a plan view schematically illustrating the size of the oxidized regions on a plane;

FIG. 5 is a graph showing the relationship between the Al concentration of an AlGaAs layer immediately below an AlAs layer in a current confining layer and the divergence angle;

DETAILED DESCRIPTION

Referring to the accompanying drawings, exemplary embodiments for implementing the present invention will be now described.

Figure 1:
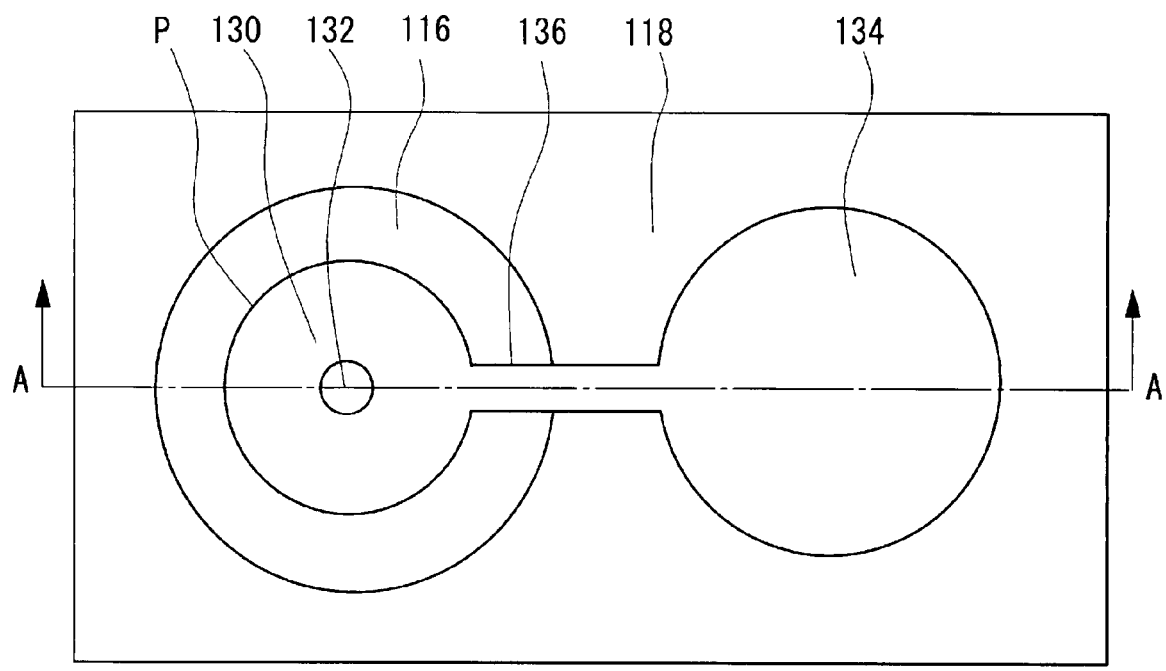
FIG. 1 is a plan view of a VCSEL according to an example of the invention.
Figure 2:
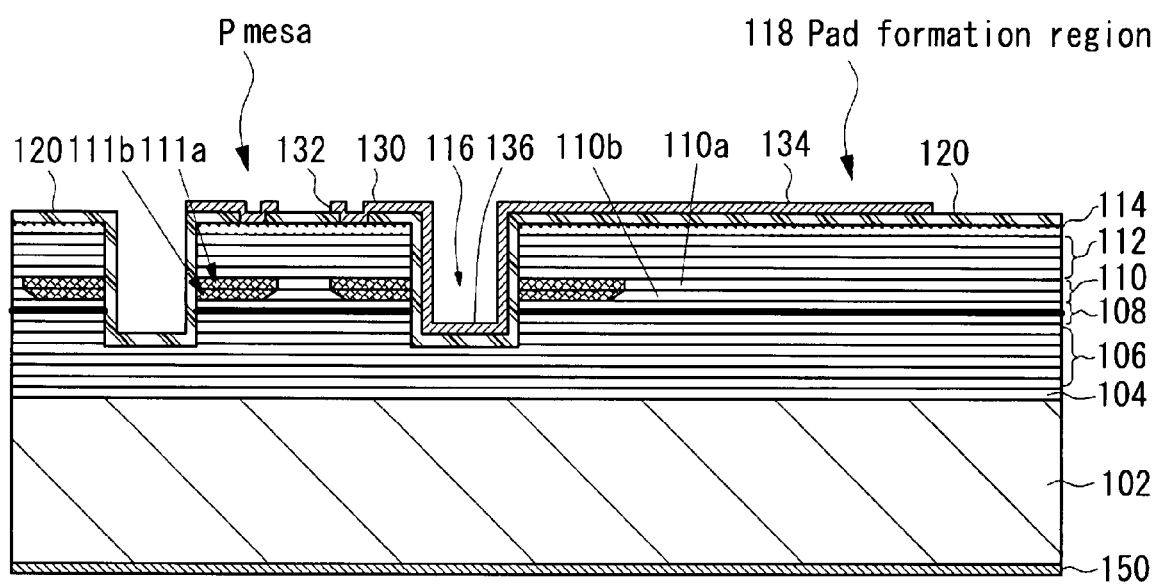
FIG. 2 is a cross sectional view taken along line A-A of FIG. 1.

FIG. 1 is a plan view of a VCSEL according to an example of the invention, and FIG. 2 is a cross sectional view taken along line A-A of FIG. 1. As shown in FIG. 1 and FIG. 2, a VCSEL 100 includes an n-side electrode 150 on the back surface of an n-type GaAs substrate 102. Stacked on the substrate 102 are semiconductor layers that include the n-type GaAs buffer layer 104, a lower DBR (Distributed Bragg Reflector) 106 made of an n-type AlGaAs semiconductor multilayer, an active region 108, a current confining layer 110 made of two layers, a p-type AlAs layer and a p-type AlGaAs layer, an upper DBR 112 made of a p-type AlGaAs semiconductor multilayer, and a p-type GaAs contact layer 114.

To the substrate 102, a ring-shaped groove 116 is formed by etching the semiconductor layers such that the groove 116 has a depth from the contact layer 114 to a portion of the lower DBR 106 or just below the current confining layer. By the groove 116, a cylindrical mesa P or post that is a laser light emitting portion is formed, and a pad formation region 118 is formed isolated from the mesa P. The mesa P forms a resonator structure made of the lower DBR 106 and the upper DBR 112, and therebetween, the active region 108 and the current confining layer 110 are interposed.

As described above, the current confining layer 110 includes a p-type AlAs layer 110a and a p-type AlGaAs layer 110b below the layer 110a. The AlAs layer 110a and p-type AlGaAs layer 110b are exposed at a side surface of the mesa P when the mesa P is formed, and concurrently oxidized from the side surface of the mesa P in a subsequent oxidizing process. By the oxidation, oxidized regions 111a and 111b are formed in the AlAs layer 110a and p-type AlGaAs layer 110b, and a conductive region surrounded by the oxidized regions 111a and 111b is formed. In the conductive region, current and light are confined.

On the entire surface of the substrate including the groove 116, an interlayer insulating film 120 is formed. The interlayer insulating film 120 covers the surface of the mesa P, side surface of the mesa P exposed by the groove 116, the groove 116, side surface of the pad formation region 118 exposed by the groove 116, and the surface of the pad formation region 118. At a top portion of the mesa P, an annular contact hole is formed in the interlayer insulating film 120. Through the contact hole, a p-side round-shaped upper electrode 130 is electrically coupled to the contact layer 114. The p-side upper electrode 130 is made of gold or titanium/gold, and at a center portion thereof, a round-shaped opening 132 that defines a laser light emitting region is formed. In the example of FIG. 2, the opening 132 is blocked by the interlayer insulating film 120 and protected such that the GaAs contact layer 114 is not exposed to the outside. The opening 132 is not necessarily blocked by the interlayer insulating film 120, and may be exposed.

In the pad formation region 118, a round-shaped electrode pad 134 is formed on the interlayer insulating film 120. The electrode pad 134 is connected to the p-side upper electrode 130 via an extraction electrode wiring 136 that extends in the groove 116.

Figure 3:
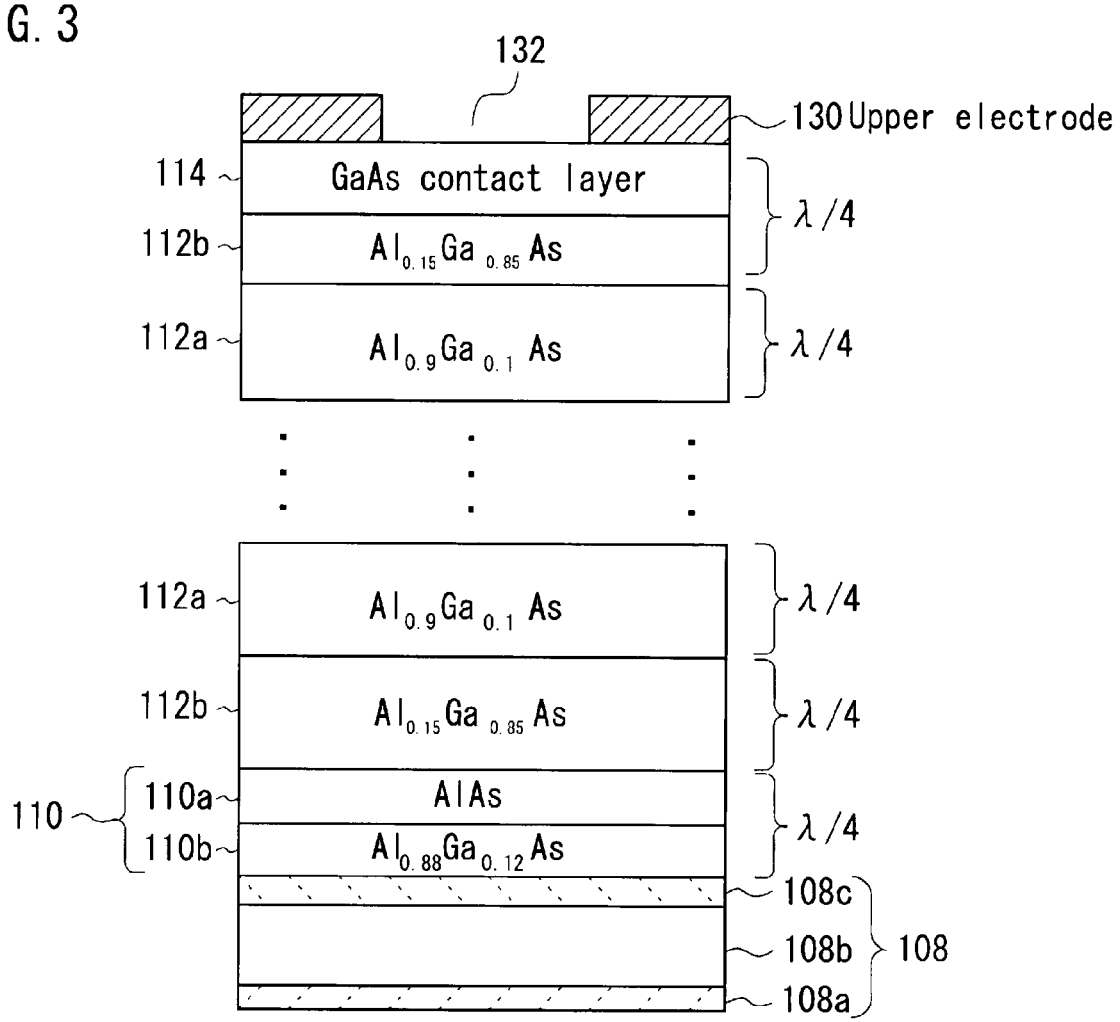
FIG. 3 is an enlarged view showing details of the mesa shown in FIG. 2.

FIG. 3 is an enlarged cross sectional view of a portion of the mesa of FIG. 2. The active region 108 is formed of an undoped lower $Al_{0.6}Ga_{0.4}As$ spacer layer 108a, an undoped quantum well active layer 108b (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer 108c.

The upper DBR 112 is made by alternately stacking 30 periods of a high-Al-composition $Al_{0.9}Ga_{0.1}As$ layer 112a and a low-Al-composition $Al_{0.15}Ga_{0.85}As$ layer 112b such that the thickness of each of the layers becomes ¼ of the wavelength λ in the medium. On the $Al_{0.15}Ga_{0.85}As$ layer 112b that is the final layer or top layer of the upper DBR 112, the GaAs contact layer 114 is formed such that optical thickness being sum of the top layer $Al_{0.15}Ga_{0.85}As$ layer 112b and the GaAs contact layer 114 becomes λ/4. This is because a layer having a lower percentage of Al content is less likely to be oxidized, and thus easier to provide electrical contact. In an example of the present invention, oscillation wavelength λ of laser light is about 850 nm.

The current confining layer 110 is formed adjacent to the spacer layer 108c. In other words, the $Al_{0.88}Ga_{0.12}As$ layer 110b is formed immediately above the spacer layer 108c, and the AlAs layer 110a having a high Al concentration is formed thereon. Optical thickness being the sum of the thickness of the $Al_{0.88}Ga_{0.12}As$ layer 110b and the AlAs layer 110a is ¼ of wavelength λ of laser light. The current confining layer 110 is one of the semiconductor layers of the upper DBR 112.

FIG. 4A is a cross sectional view schematically illustrating end surfaces of oxidized regions formed in the AlAs layer 110a and $Al_{0.88}Ga_{0.12}As$ layer 110b. FIG. 4B is a plan view schematically illustrating the size of the oxidized regions on a plane.

The current confining layer 110 is oxidized from the side surface of the mesa P in a vapor atmosphere at about 340 degrees Celsius for a certain period of time, as described later. The AlAs layer 110a has a higher Al concentration than that of the $Al_{0.88}Ga_{0.12}As$ layer 110b, and has a higher oxidation speed in a lateral direction. Therefore, an end surface E1 of the oxidized region 111a of the AlAs layer 110a is nearly right angled. On the other hand, in the oxidation of the $Al_{0.88}Ga_{0.12}As$ layer 110b, oxygen enters perpendicularly from the AlAs layer 110a, and thus oxidation proceeds at a portion nearer the AlAs layer 110a. As a result, an end surface E2 of the oxidized region 111b in the AlGaAs layer 110b is inclined. The inclination angle θ of the end surface E2 depends on the Al concentration of the AlGaAs layer 110b. The higher the Al concentration is, the faster oxidation in a lateral direction becomes, and thus the inclination angle θ becomes greater, resulting in a steeper inclination.

As shown in FIG. 4B, the outlines of conductive regions formed by the oxidized regions 111a and 111b in the AlAs layer 110a and $Al_{0.88}Ga_{0.12}As$ layer 110b in a plan view are round shapes that reflect the outline of the mesa P. The diameter of a conductive region P1 surrounded by the oxidized region 111a controls a single-mode of laser light and threshold current. Preferably, the oxidation distance is controlled such that the diameter becomes about 3 μm.

On the other hand, a diameter D2 on the lowermost surface of a conductive region P2 surrounded by the oxidized region 111$b$ in the $Al_{0.88}Ga_{0.12}As$ layer 110$b$ is calculated by D2=D1+2T/tan θ (where T is thickness of the $Al_{0.88}Ga_{0.12}As$ layer 110$b$), and is about 8 μm, for example. As described above, the inclination angle θ depends on the Al concentration of the AlGaAs layer 110$b$, and as the Al concentration becomes higher, the inclination angle θ becomes greater accordingly. Therefore, the diameter of D2 of the conductive region P2 can be determined by Al concentration and thickness T of the AlGaAs layer 110$b$. In this example, a diameter of D3 of the opening 132 formed in the upper electrode 130 is greater than the diameter of D1 of the conductive region P1, and the opening 132 does not control the divergence angle of laser light.

FIG. 5 is a graph showing the relationship between the divergence angle of laser light and the Al concentration of an AlGaAs layer 110$b$ formed immediately below an AlAs layer in a current confining layer. As obvious from the graph, if the Al concentration of the AlGaAs layer is made as small as in a range from about 0.90 to 0.85, the divergence angle of laser light becomes as small as about 17 degrees to about 14 degrees.

As such, according to an example of the invention, the AlGaAs layer 110$b$ having a lower Al concentration than that of the AlAs layer 110$a$ is formed in the current confining layer 110, and thus an inclination on the end surface E2 of the oxidized region 111$b$ is created. With such configuration, light confining amount can be reduced, and divergence angle or FFP can be reduced, and an acute FFP can be obtained.

In addition, the control of the divergence angle is not performed by the diameter D1 of the conductive region P1 formed in the high-Al-concentration AlAs layer 110$a$ in the current confining layer 110, but can be performed by the Al concentration of the AlGaAs layer 110$b$ provided immediately below thereof. Therefore, the control of the divergence angle may become easier than that of related arts.

Also, the control of single-mode and the control of the divergence angle can be performed by individual AlAs layer and AlGaAs layer. Therefore, single-mode and divergence angle, which are in an antinomic relation, can be optimized.

Furthermore, the Al concentration of the AlGaAs layer 110$b$ is relatively easily provided because it is provided only by altering Al concentration of the AlGaAs layer that composes the upper DBR. In addition, by forming the current confining layer 110 adjacent to the active region 108, confining amount of light that is generated at the active region 108 can be more effectively reduced.

In the example described above, the current confining layer 110 is made of the AlAs layer 110$a$ and $Al_{0.88}Ga_{0.12}As$ layer 110$b$, but it is an example only. The current confining layer 110 can be made of a high-Al-concentration $Al_xGa_{1-x}As$ layer and a low-Al-concentration $Al_yGa_{1-y}As$ layer, in the relation of x>y. Preferably, 0.85<y<0.90 when x=1.

Figure 17:
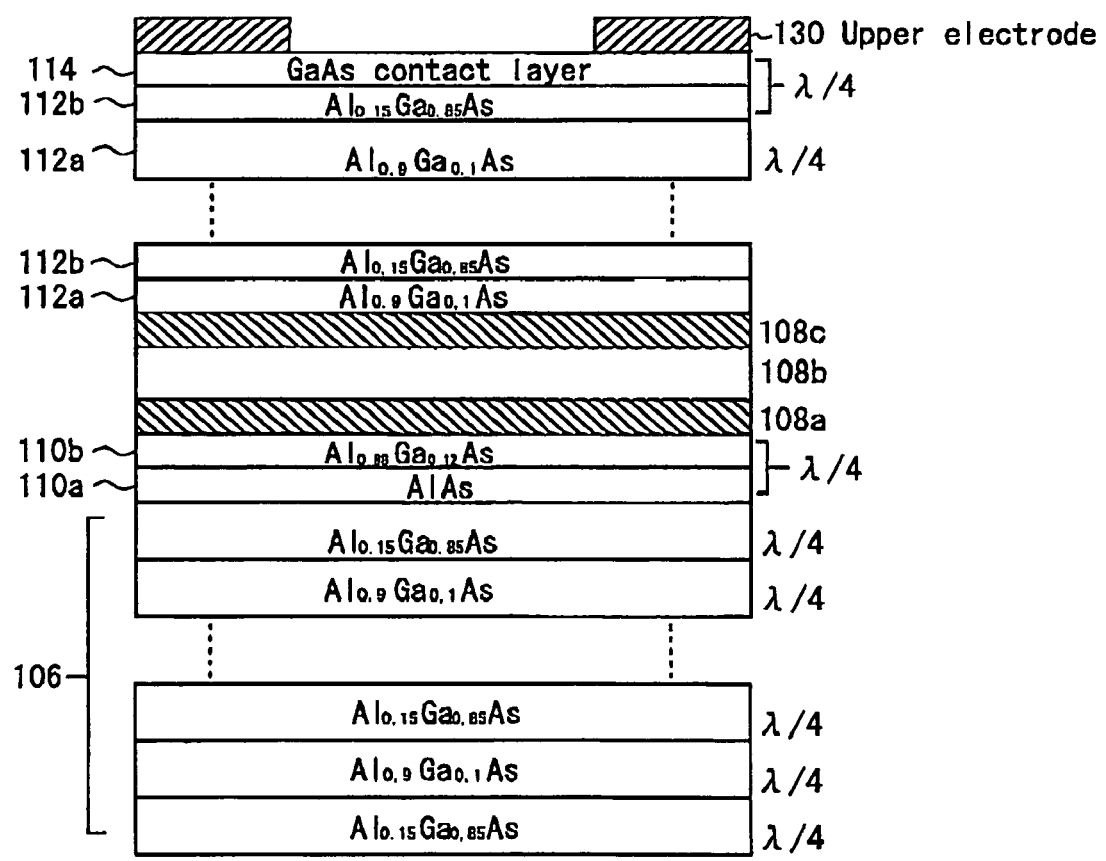
FIG. 17 is an alternative embodiment of the mesa shown in FIG. 3.

In the example described above, the current confining layer 110 is formed in the upper DBR, however, the current confining layer 110 may be formed in the lower DBR as shown in FIG. 17. In this case, it is desirable that the current confining layer 110 be in proximity to the active region 108. In addition, the current confining layer 110 has n-type, and the mesa P extends to the lower DBR, exposing the side surface of the current confining layer 110.

In the example described above, a single mesa P is formed on the substrate; however, multiple mesas may be formed on a substrate to act as a multi-beam or multi-spot that emits laser light concurrently from the multiple mesas. Also, in the example described above, oscillation wavelength is 850 nm; however, wavelength is not necessarily specified and may be other wavelength such as 780 nm. Furthermore, in the example described above, a VCSEL is shown in which an AlGaAs-type compound semiconductor is used; however, the present invention can also be applicable to a VCSEL in which other III-V group compound semiconductor is used. In addition, the shape of the mesa may be rectangular, other than a cylindrical shape.

Figure 6A:
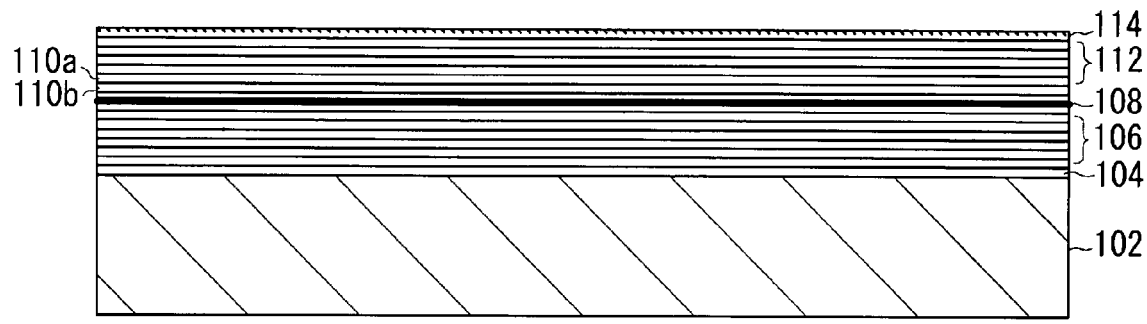
FIGS. 6A to 6C are cross sectional views illustrating steps of a method for manufacturing a VCSEL according to a first example of the present invention.

Referring now to FIGS. 6A to 8B, a method for manufacturing a VCSEL of an example will be described. As shown in FIG. 6A, by Metal Organic Chemical Vapor Deposition (MOCVD), on the n-type GaAs substrate 102, an n-type GaAs buffer layer 104 having a carrier concentration of $1 \times 10^{18}$ cm$^{-3}$ and a thickness of about 0.2 μm is deposited. On the buffer layer 104, 40.5 periods of $Al_{0.9}Ga_{0.1}As$ and $Al_{0.15}Ga_{0.85}As$, each having a thickness of ¼ of the wavelength λ in the medium, are alternately stacked to form the lower n-type DBR 106 having a carrier concentration of $1 \times 10^{18}$ cm$^{-3}$ and a total thickness of about 4 μm. Stacked on the lower DBR 106 is the active region 108 made of an undoped lower $Al_{0.6}Ga_{0.4}As$ spacer layer, an undoped quantum well active layer (made of three GaAs quantum well layers each having a thickness of 70 nm and four $Al_{0.3}Ga_{0.7}As$ barrier layers each having a thickness of 50 nm), and an undoped upper $Al_{0.6}Ga_{0.4}As$ spacer layer. Stacked on the active region 108 is the upper p-type DBR 112 having a carrier concentration of $1 \times 10^{18}$ cm$^{-3}$ and a total thickness of about 2 μm that is made by stacking 30 periods of $Al_{0.9}Ga_{0.1}As$ and $Al_{0.15}Ga_{0.85}As$ such that the thickness of each of the layers becomes ¼ of the wavelength λ in the medium.

At a lowermost portion of the upper DBR 112, the AlAs layer 110$a$ and AlGaAs layer 110$b$ are interposed for selective oxidation, and the pair of the AlAs layer 110$a$ and AlGaAs layer 110$b$ is also made to become ¼ of the wavelength, λ in the medium. The Al-composition of the AlGaAs layer 110$b$ is 88%. In the uppermost layer of the upper DBR 112, the p-type GaAs contact layer 114 having a carrier concentration of $1 \times 10^{19}$ cm$^{-3}$ and a thickness of about 20 nm is formed. Although not described in detail, to reduce electrical resistance of the DBR layer, a region having a thickness of about 20 nm in which the Al-composition varies stepwise from 90% to 15% can be provided on the interface between the $Al_{0.9}Ga_{0.1}As$ and the $Al_{0.15}Ga_{0.85}As$. Deposition to form these layers is continuously performed by using trimethyl gallium, trimethyl aluminum, or arsine as a source gas, which are changed sequentially, and using cyclopentadinium magnesium as a p-type dopant material, and silane as an n-type dopant, with the substrate temperature being kept at 750 degrees Celsius, without breaking vacuum.

Figure 6B:
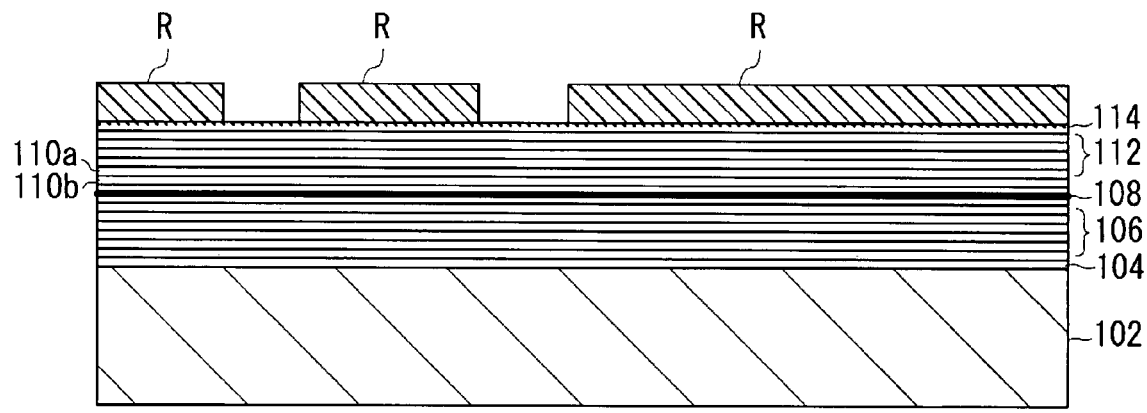
Figure 6C:
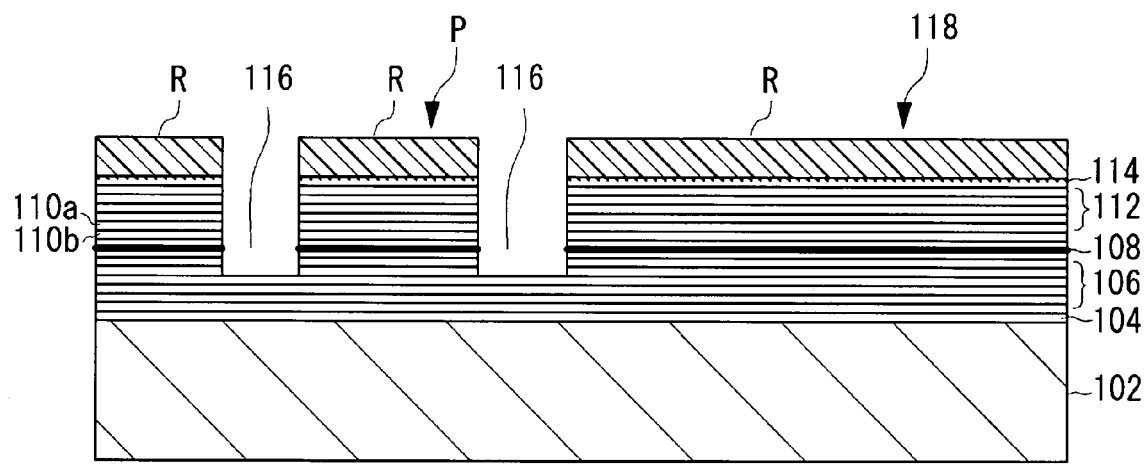

Next, as shown in FIG. 6B, by using a photolithography process, a resist mask R is formed on the epitaxial growth layer. Then, a reactive ion etching is performed by using boron trichloride as an etching gas to form the annular groove 116 to a middle portion of the lower DBR 106, as shown in FIG. 6C. By this process, a cylindrical semiconductor mesa P having a diameter of about 10 to 30 μm or a rectangular prism shaped semiconductor mesa P and the pad formation region 118 surrounding the mesa P are formed. By the formation of the mesa P, the AlAs layer 110$a$ and $Al_{0.88}Ga_{0.12}As$ layer 110$b$ immediately below the AlAs layer 110$a$ in the current confining layer 110 are exposed at the side surface of the mesa.

Figure 7A:
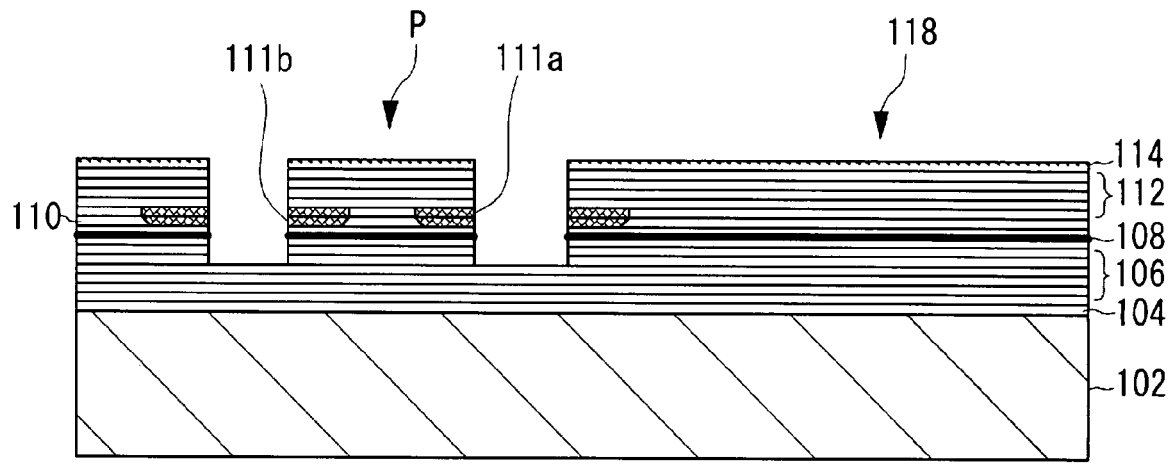
FIGS. 7A to 7C are cross sectional views illustrating steps of a method for manufacturing a VCSEL according to a first example of the present invention.

Then, after the resist R is removed, as shown in FIG. 7A, the substrate is exposed to a vapor atmosphere at 340 degrees Celsius, for example, for a certain amount of time to perform an oxidation process. The AlAs layer 110$a$ and $Al_{0.88}Ga_{0.12}As$ layer 110b that make up the current confining layer 110 are oxidized from the side surface of the mesa P, reflecting the shape of the post, and a non-oxidized region (conductive region) that is left unoxidized becomes a current injecting region or conductive region. During this process, an end surface of the oxidized region 111b in the $Al_{0.88}Ga_{0.12}As$ layer 110b is inclined.

Figure 7B:
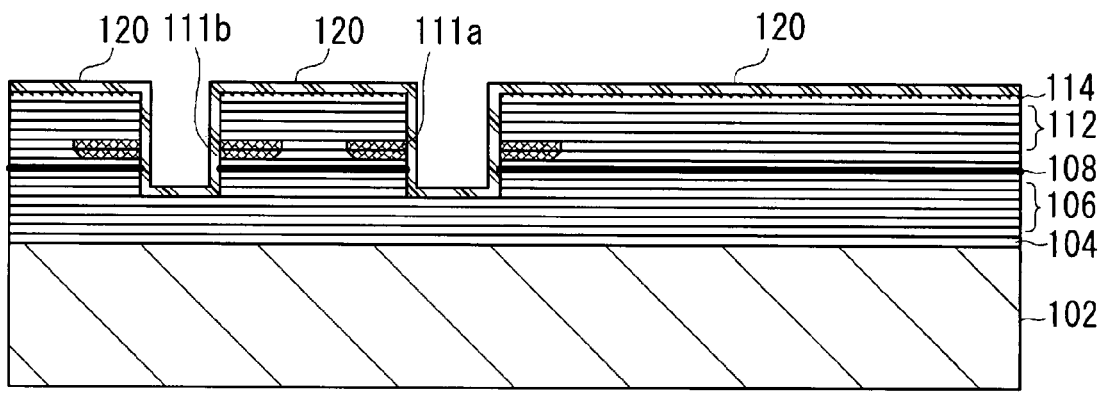
Figure 7C:
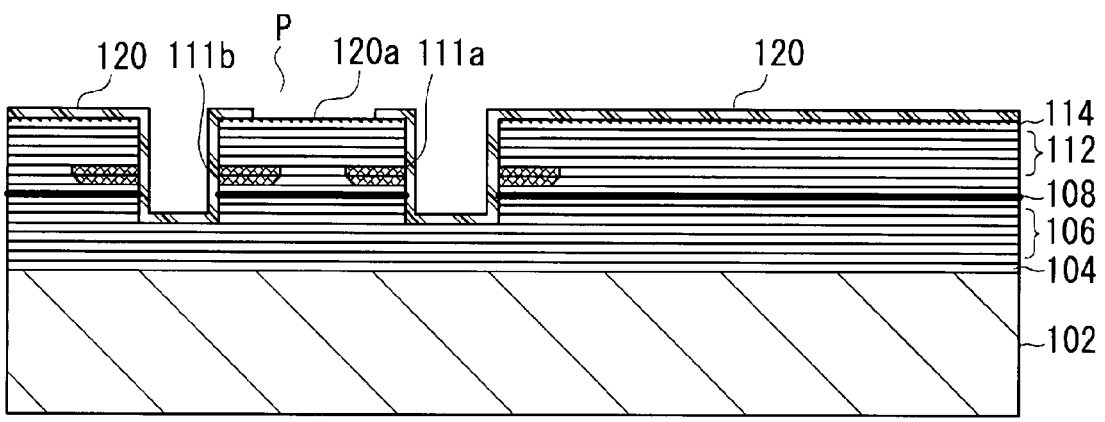

Next, as shown in FIG. 7B, by using a plasma CVD apparatus, the interlayer insulating film 120 made of SiN is deposited on the entire surface of the substrate including the groove 116. After that, as shown in FIG. 7C, the interlayer insulating film 120 is etched by using a general photolithography process to form a round-shaped contact hole 120a in the interlayer insulating film 120 at a top portion of the mesa P, and to expose the contact layer 114. Alternatively, the contact hole 120a may be made in a ring-shaped, and the contact layer 114 that becomes an emitting region may be protected with SiN, as shown in FIG. 2.

Figure 8A:
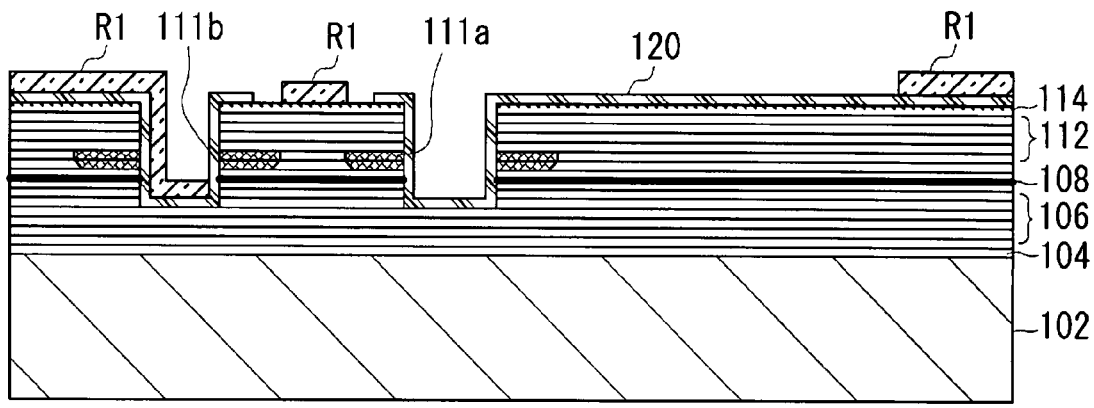
FIGS. 8A and 8B are cross sectional views illustrating steps of a method for manufacturing a VCSEL according to a first example of the present invention.
Figure 8B:
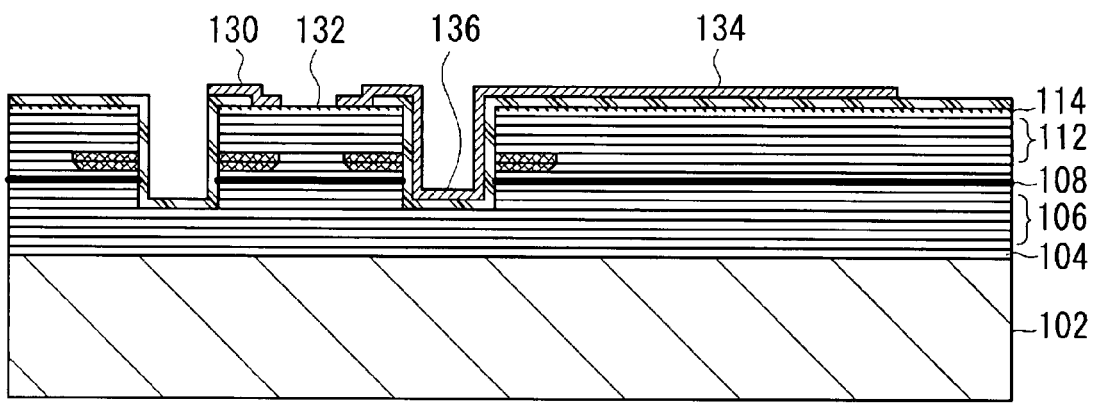

After that, as shown in FIG. 8A, a resist pattern R1 is formed in a center portion of an upper portion of the mesa P by using a photolithography process. From above the resist pattern R1, by using an EB deposition apparatus, 100 to 1000 nm, and preferably 600 nm, of Au is deposited as a p-side electrode material. When the resist pattern R1 is peeled off, the Au on the resist pattern R1 is removed as shown in FIG. 8B, and the upper electrode 130, electrode pad 134, and extraction wiring 136 are formed. From the portion without p-side electrode, that is, from the opening 132 at a center portion of the post, laser light is emitted. Although not described here in detail, a metal opening portion formed on the mesa P may be formed prior to the formation of the post.

On the back surface of the substrate, Au/Ge is deposited as an n-electrode. After that, annealing is performed with an annealing temperature at 250 to 500 degrees Celsius, and preferably at 300 to 400 degrees Celsius, for 10 minutes. The annealing duration is not necessarily limited to 10 minutes, and may be in a range from 0 to 30 minutes. Also, the deposition method is not necessarily limited to the EB deposition, and a resistance heating method, sputtering method, magnetron sputtering method, or CVD method may be used. In addition, the annealing method is not necessarily limited to thermal annealing using a general electric furnace, and a similar effect can be obtained by flash annealing or laser annealing using infrared radiation, annealing by high frequency heating, annealing by electron beam, or annealing by lamp heating.

Figure 9:
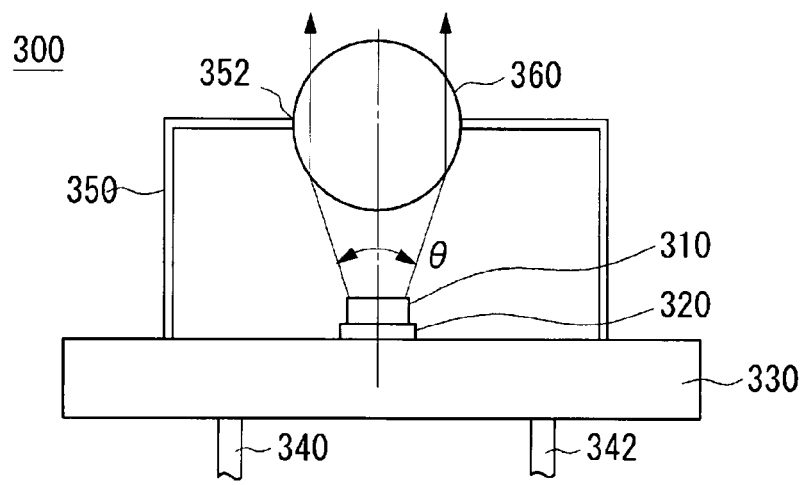
FIG. 9 is a schematic cross sectional view of a configuration of an optical device in which a VCSEL according to an example of the invention is implemented.

Referring to the accompanying drawings, an optical device (module), a light sending device, an optical transmission system, an optical transmission device, or the like will be now described. FIG. 9 is a cross sectional view showing a configuration of an optical device in which a VCSEL is mounted. In an optical device 300, a chip 310 in which a VCSEL is formed is fixed on a disc-shaped metal stem 330 through a conductive adhesive 320. Conductive leads 340 and 342 are inserted into through holes (not shown) formed in the stem 330. One lead 340 is electrically coupled to an n-side electrode of the VCSEL, and the other lead 342 is electrically coupled to a p-side electrode of the VCSEL.

Above the stem 330 that includes the chip 310, a rectangular hollow cap 350 is fixed, and a ball lens 360 is fixed in an opening in a center portion of the cap 350. The optical axis of the ball lens 360 is positioned to match an approximate center of the chip 310. When a forward voltage is applied between the leads 340 and 342, laser light is emitted perpendicularly from the chip 310. The distance between the chip 310 and the ball lens 360 is adjusted such that the ball lens 360 is contained within the divergence angle θ of the laser light from the chip 310. In addition, the optical device 300 may include a light sensing element or a thermal sensor to monitor the emitting status of the VCSEL.

Figure 10:
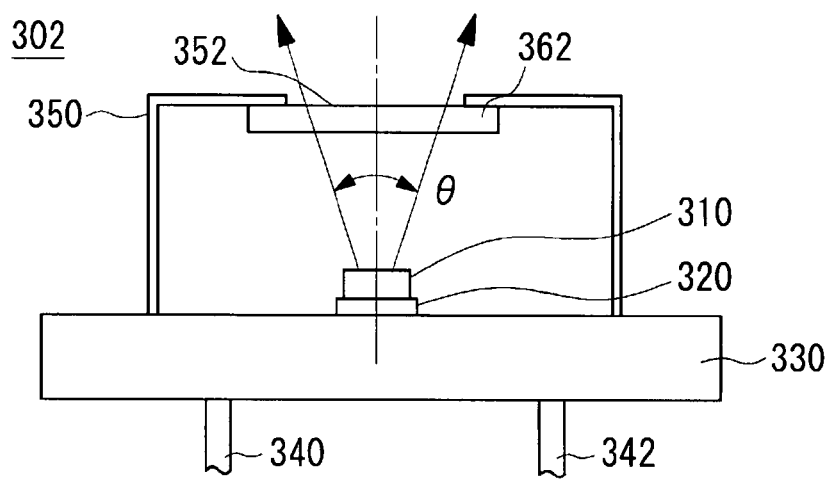
FIG. 10 is a schematic cross sectional view showing a configuration of another optical device.

FIG. 10 illustrates a configuration of another optical device. In an optical device 302 shown in FIG. 10, instead of using the ball lens 360, a flat-plate glass 362 is fixed in an opening in a center portion of the cap 350. The center of the flat-plate glass 362 is positioned to match an approximate center of the chip 310. The distance between the chip 310 and the flat-plate glass 362 is adjusted such that the opening diameter of the flat-plate glass 362 is equal to or greater than the divergence angle θ of the laser light from the chip 310.

Figure 11:
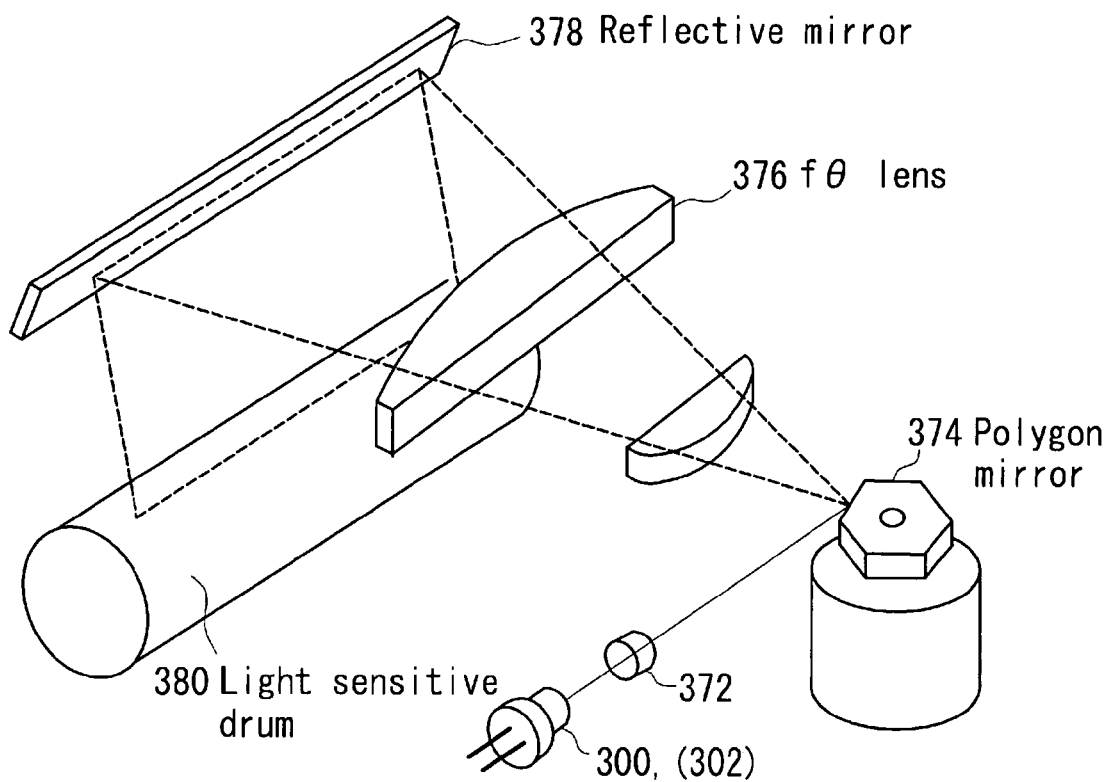
FIG. 11 illustrates an example of a configuration of a light irradiation device that uses a VCSEL.

FIG. 11 shows an example in which a VCSEL is used as a light source. A light irradiation device 370 includes the optical device 300 (302) in which a VCSEL is mounted as shown in FIG. 9 or FIG. 10, a collimator lens 372 that receives multi-beam laser light from the optical device 300 (302), a polygon mirror 374 that rotates at a certain speed and reflects the light rays from the collimator lens 372 with a certain divergence angle, an fθ lens 376 that receives laser light from the polygon mirror 374 and projects the laser light on a reflective mirror 378, the line-shaped reflective mirror 378, and a light sensitive drum 380 that forms a latent image based on the reflected light from the reflective mirror 378. As such, a VCSEL array can be used for a light source for an optical data processing apparatus, for example, a copy machine or printer equipped with an optical system that collects laser light from a VCSEL on a light sensitive drum, and a mechanism that scans the collected laser light on the light sensitive drum.

Figure 12:
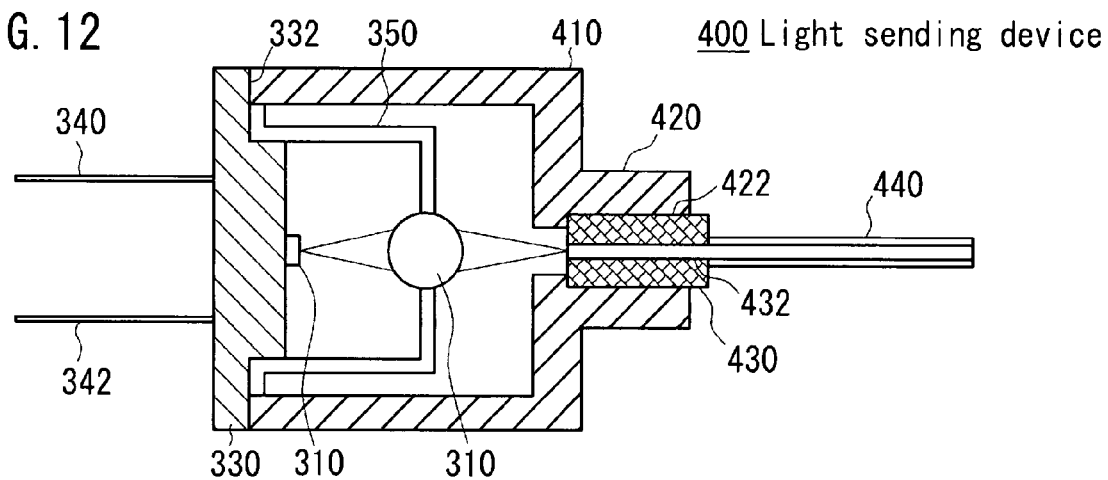
FIG. 12 is a schematic cross sectional view illustrating a configuration of a light sending device in which the optical device shown in FIG. 9 is used.

FIG. 12 is a cross sectional view illustrating a configuration in which the optical device shown in FIG. 9 is applied to a light sending device. A light sending device 400 includes a cylindrical housing 410 fixed to the stem 330, a sleeve 420 formed integral with the housing 410 on an edge surface thereof, a ferrule 430 held in an opening 422 of the sleeve 420, and an optical fiber 440 held by the ferrule 430. In a flange 332 formed in a direction of the circumference of the stem 330, an edge portion of the housing 410 is fixed. The ferrule 430 is positioned exactly in the opening 422 of the sleeve 420, and the optical axis of the optical fiber 440 is aligned with the optical axis of the ball lens 360. In a through hole 432 of the ferrule 430, the core of the optical fiber 440 is held.

Laser light emitted from the surface of the chip 310 is concentrated by the ball lens 360. The concentrated light is injected into the core of the optical fiber 440, and transmitted. Although the ball lens 360 is used in the example described above, other lens such as a biconvex lens or plano-convex lens may be used. In addition, the light sending device 400 may include a driving circuit for applying an electrical signal to the leads 340 and 342. Furthermore, the light sending device 400 may have a receiving function for receiving an optical signal via the optical fiber 440.

Figure 13:
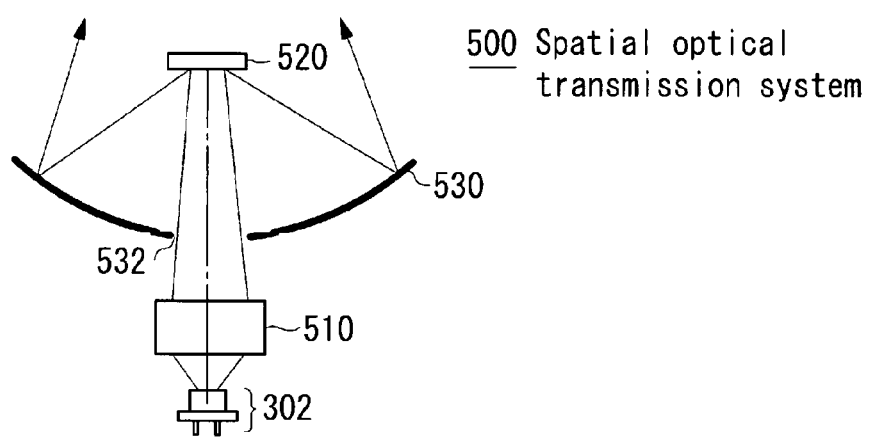
FIG. 13 illustrates an example of a configuration in which the optical device shown in FIG. 10 is used in a spatial transmission system.

FIG. 13 illustrates a configuration in which the module shown in FIG. 10 is used in a spatial transmission system. A spatial transmission system 500 includes the optical device 302, a condensing lens 510, a diffusing plate 520, and a reflective mirror 530. The light concentrated by the condensing lens 510 is reflected by the diffusing plate 520 through an opening 532 of the reflective mirror 530. The reflected light is reflected toward the reflective mirror 530. The reflective mirror 530 reflects the reflected light toward a predetermined direction to perform optical transmission.

Figure 14:
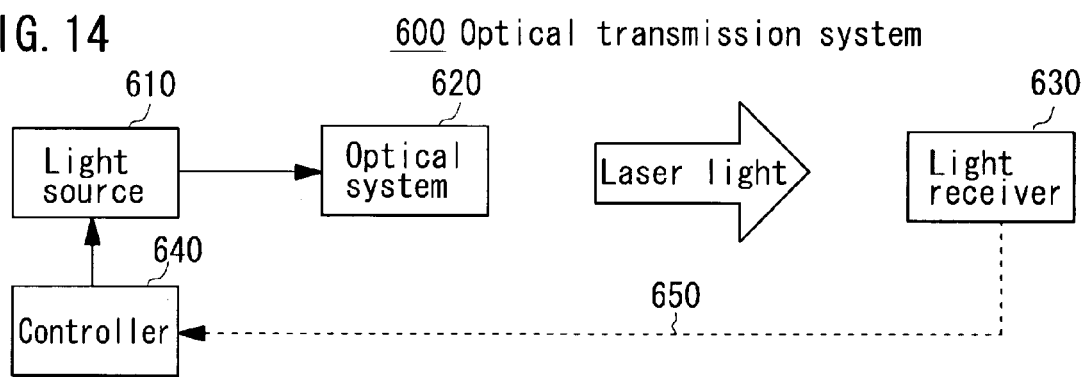
FIG. 14 is a block diagram illustrating a configuration of an optical transmission system.

FIG. 14 illustrates an example of a configuration of an optical transmission system in which a VCSEL is used as a light source. An optical transmission system 600 includes a light source 610 that contains the chip 310 in which a VCSEL is formed, an optical system 620, for example, for concentrating laser light emitted from the light source 610, a light receiver 630 for receiving laser light outputted from the optical system 620, and a controller 640 for controlling the driving of the light source 610. The controller 640 provides a driving pulse signal for driving the VCSEL to the light source 610. The light emitted from the light source 610 is transmitted through the optical system 620 to the light receiver 630 by means of an optical fiber or a reflective mirror for spatial transmission. The light receiver 630 detects received light by a photo-detector, for example. The light receiver 630 is capable of controlling operations (for example, the start timing of optical transmission) of the controller 640, by a control signal 650.

Figure 15:
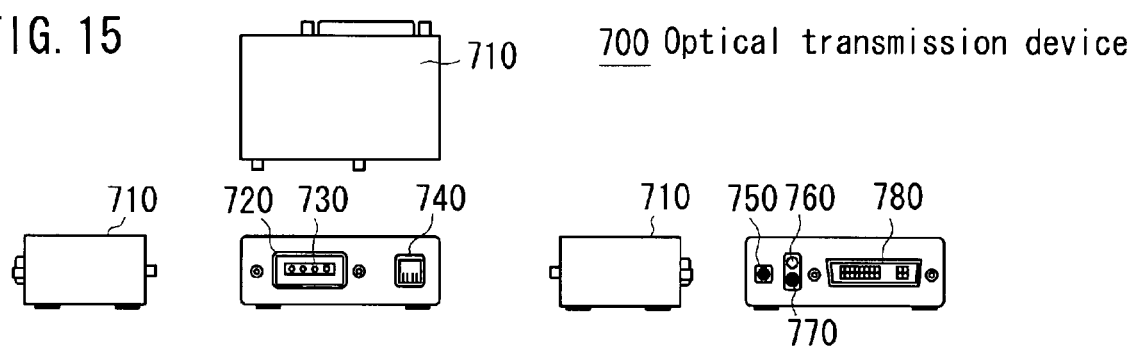
FIG. 15 illustrates an outer configuration of an optical transmission device.

Next, an example of a configuration of an optical transmission device used for an optical transmission system is shown in FIG. 15. An optical transmission device 700 includes a case 710, an optical signal transmitting/receiving connector 720, a light emitting/light receiving element 730, an electrical signal cable connector 740, a power input 750, an LED 760 for indicating normal operation, an LED 770 for indicating an abnormality, and a DVI connector 780, and has a transmitting circuit board/receiving circuit board mounted inside.

Figure 16:
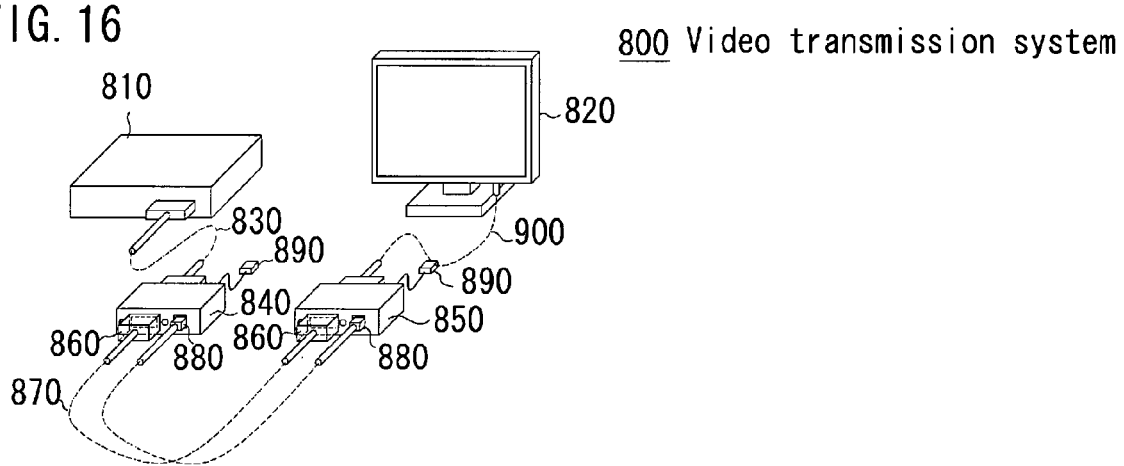
FIG. 16 illustrates a video transmission system that uses the optical transmission device of FIG. 15.

Shown in FIG. 16 is an example of a video transmission system in which the optical transmission device 700 is used. A video transmission system 800 uses the optical transmission device shown in FIG. 15 to transmit a video signal generated at a video signal generator 810 to an image display 820 such as a liquid crystal display. More specifically, the video transmission system 800 includes the video signal generator 810, the image display 820, an electrical cable 830 for DVI, a transmitting module 840, a receiving module 850, connectors 860 for a video signal transmission optical signal, an optical fiber 870, electrical cable connectors 880 for a controlling signal, power adapters 890, and an electrical cable 900 for DVI.

In the video transmission system described above, the transmissions between the video signal generator 810 and the transmitting module 840, and between the receiving module 850 and the image display 820 are performed by an electrical signal through the electrical cables 830 and 900, respectively. However, these transmissions may be performed by an optical signal. For example, instead of using electrical the cables 830 and 900, a signal transmission cable in which an electrical/optical converter circuit and an optical/electrical converter circuit are contained in a connector may be used.

A VCSEL according to an aspect of the invention can be used in fields such as optical data processing or optical high-speed data communication.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with various modifications as are suited to the particular use contemplated. It is intended that the scope of the invention be defined by the following claims and their equivalents.

What is claimed is:

1. A Vertical-Cavity Surface-Emitting Laser diode (VCSEL) comprising:
    a first semiconductor mirror layer of a first conductivity type on a substrate, an active region on the first semiconductor mirror layer, a second semiconductor mirror layer of a second conductivity type on the active region, and a current confining layer in proximity to and directly on the active region; and
    a mesa structure formed such that at least a side surface of the current confining layer is exposed; and
    the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure;
    wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

2. The VCSEL according to claim 1, wherein the second semiconductor layer in the current confining layer is formed adjacent to the active region, and the first semiconductor layer is formed adjacent to the second semiconductor layer.

3. The VCSEL according to claim 1, wherein the current confining layer is formed in the second semiconductor mirror layer, and the first semiconductor layer is an $Al_xGa_{1-x}As$ layer of the second conductivity type, and the second semiconductor layer is an $Al_yGa_{1-y}As$ layer of the second conductivity type, and $x>y$.

4. The VCSEL according to claim 1, wherein the current confining layer is formed in the first semiconductor mirror layer, and the first semiconductor layer is an $Al_xGa_{1-x}As$ layer of the first conductivity type, and the second semiconductor layer is an $Al_yGa_{1-y}As$ layer of the first conductivity type, and $x>y$.

5. The VCSEL according to claim 3, wherein x of the first semiconductor layer equals to 1, and y of the second semiconductor layer is about $0.85<y<0.90$.

6. The VCSEL according to claim 4, wherein the first semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

7. The VCSEL according to claim 1, wherein the diameter of a conductive region surrounded by an oxidized region formed in the first semiconductor layer in the current confining layer is at least equal to or smaller than 5.0 micrometers.

8. The VCSEL according to claim 1, wherein the second semiconductor mirror layer comprises a contact layer in the uppermost layer, and an electrode layer on which an opening for emitting laser light being formed is formed on the contact layer.

9. An optical device comprising:
    a VCSEL;

an electrical connecting terminal electrically coupled to the VCSEL; and an optical component for injecting light that is emitted from the VCSEL, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

10. A light irradiation device comprising:

a VCSEL;

an optical component comprising at least one of a lens or a mirror; and an irradiation unit for irradiating light that is emitted from the VCSEL through the optical component, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

11. A data processing device comprising:

an optical device; and a sending unit for sending light that is emitted from the VCSEL, the optical device including the VCSEL, an electrical connecting terminal electrically coupled to the VCSEL, and an optical component for injecting light that is emitted from the VCSEL, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

12. A light sending device comprising:

an optical device; and a sending unit for sending light that is emitted from a VCSEL, the optical device including the VCSEL, an electrical connecting terminal electrically coupled to the VCSEL, and an optical component for injecting light that is emitted from the VCSEL, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

13. An optical spatial transmission device comprising:

an optical device; and a transmission unit for spatially transmitting light that is emitted from a VCSEL, the optical device including the VCSEL, an electrical connecting terminal electrically coupled to the VCSEL, and an optical component for injecting light that is emitted from the VCSEL, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

14. An optical transmission system comprising:

an optical device; and a transmission unit for transmitting light that is emitted from a VCSEL, the optical device including the VCSEL, an electrical connecting terminal electrically coupled to the VCSEL, and an optical component for injecting light that is emitted from the VCSEL, the VCSEL including a first semiconductor mirror layer of a first conductivity type on a substrate, an active region on the first semiconductor mirror layer, a second semiconductor mirror layer of a second conductivity type on the active region, and a current confining layer in proximity to and directly on the active region, and a mesa structure formed such that at least a side surface of the current confining layer is exposed, and the current confining layer comprising a first semiconductor layer including an Al-composition and a second semiconductor layer including an Al-composition and being formed nearer to the active region than the first semiconductor layer does, the first semiconductor layer and the second semiconductor layer forming the current confining layer being directly adjacent and in contact, and Al concentration of the first semiconductor layer being higher than Al concentration of the second semiconductor layer, and optical thickness that is sum of the thickness of the first and second semiconductor layers being $\lambda/4$ when oscillation wavelength of laser light is $\lambda$, and the first and second semiconductor layers being selectively oxidized from the side surface of the mesa structure, and an end surface of an oxidized region of the second semiconductor layer being inclined relative to the side surface of the mesa structure, wherein the second semiconductor mirror layer is formed by alternately stacking a first AlGaAs layer having a high Al-composition and a second AlGaAs layer having a low Al-composition, and Al concentration of the second semiconductor layer in the current confining layer is lower than Al concentration of the first AlGaAs layer.

* * * * *